US009454084B2

(12) United States Patent
Lyulina et al.

(10) Patent No.: US 9,454,084 B2
(45) Date of Patent: Sep. 27, 2016

(54) METHOD TO DETERMINE THE USEFULNESS OF ALIGNMENT MARKS TO CORRECT OVERLAY, AND A COMBINATION OF A LITHOGRAPHIC APPARATUS AND AN OVERLAY MEASUREMENT SYSTEM

(71) Applicant: ASML NETHERLANDS B.V., Veldhoven (NL)

(72) Inventors: Irina Lyulina, Son (NL); Franciscus Godefridus Casper Bijnen, Valkenswaard (NL); Remi Daniel Marie Edart, Eindhoven (NL); Antoine Gaston Marie Kiers, Veldhoven (NL); Michael Kubis, Düsseldorf (DE)

(73) Assignee: ASML NETHERLANDS B.V., Veldhoven (NL)

( * ) Notice: Subject to any disclaimer, the term of this patent is extended or adjusted under 35 U.S.C. 154(b) by 145 days.

(21) Appl. No.: 14/403,577

(22) PCT Filed: Apr. 23, 2013

(86) PCT No.: PCT/EP2013/058375
§ 371 (c)(1),
(2) Date: Nov. 24, 2014

(87) PCT Pub. No.: WO2013/178404
PCT Pub. Date: Dec. 5, 2013

(65) Prior Publication Data
US 2015/0146188 A1 May 28, 2015

Related U.S. Application Data

(60) Provisional application No. 61/652,669, filed on May 29, 2012.

(51) Int. Cl.
G03B 27/42 (2006.01)
G03F 7/20 (2006.01)
G03F 9/00 (2006.01)
G01B 11/14 (2006.01)

(52) U.S. Cl.
CPC .......... G03F 7/70141 (2013.01); G01B 11/14 (2013.01); G03F 7/70633 (2013.01); G03F 9/7046 (2013.01)

(58) Field of Classification Search
CPC ..... G01B 11/14; G01B 11/00; G01B 11/026; G01B 9/02007; G01B 9/02018; G01B 11/285; G01B 2290/30; G01B 9/02; G03F 7/70633; G03F 7/70141; G03F 7/70616; G03F 7/70625; G03F 7/70683; G03F 9/7003; G03F 9/7007; G03F 9/7088; G03F 9/7092; G03F 7/00
See application file for complete search history.

(56) References Cited

U.S. PATENT DOCUMENTS

| 6,868,301 | B1 | 3/2005 | Preil |
| 2003/0003384 | A1 | 1/2003 | Hoshi |
| 2007/0021860 | A1* | 1/2007 | Gertrudus Simons ............... G03F 7/70516 700/121 |
| 2010/0309486 | A1 | 12/2010 | Numata et al. |
| 2011/0010000 | A1 | 1/2011 | Mos et al. |
| 2011/0107279 | A1* | 5/2011 | Ikawa ..................... G06T 19/00 716/52 |

FOREIGN PATENT DOCUMENTS

| EP | 1 744 217 | 1/2007 |
| WO | WO 2005/045364 | 5/2005 |

OTHER PUBLICATIONS

C. Huang et al, "Overlay improvement by zone alignment strategy", Proceedings of SPIE, vol. 6922, Mar. 24, 2008, pp. 69221G-69221G-8.
International Search report and Written Opinion mailed Jan. 30, 2014 in corresponding International Patent Application No. PCT/US2013/068376, 11 pages.

* cited by examiner

*Primary Examiner* — Mesfin T Asfaw
(74) *Attorney, Agent, or Firm* — Pillsbury Winthrop Shaw Pittman LLP

(57) ABSTRACT

A method to determine the usefulness of an alignment mark of a first pattern in transferring a second pattern to a substrate relative to the first pattern already present on the substrate includes measuring the position of the alignment mark, modeling the position of the alignment mark, determining the model error between measured and modeled position, measuring a corresponding overlay error between first and second pattern and comparing the model error with the overlay error to determine the usefulness of the alignment mark. Subsequently this information can be used when processing next substrates thereby improving the overlay for these substrates. A lithographic apparatus and/or overlay measurement system may be operated in accordance with the method.

15 Claims, 4 Drawing Sheets

METHOD TO DETERMINE THE USEFULNESS OF ALIGNMENT MARKS TO CORRECT OVERLAY, AND A COMBINATION OF A LITHOGRAPHIC APPARATUS AND AN OVERLAY MEASUREMENT SYSTEM

CROSS-REFERENCE TO RELATED APPLICATIONS

This application is the U.S. national phase entry of International Patent Application No. PCT/EP2013/058375, filed Apr. 23, 2013, which claims the benefit of U.S. provisional application 61/652,669, which was filed on 29 May 2012, and which is incorporated herein in its entirety by reference.

BACKGROUND

1. Field of the Invention

The present invention relates to a method to determine the usefulness of alignment marks to correct overlay, and to a combination of a lithographic apparatus and an overlay measurement system capable of carrying out said method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When multiple patterns are transferred subsequently to a substrate, it may be desired to align subsequent patterns relative to each other. To align a subsequent pattern to a previously transferred pattern it is important to know the location of the previously transferred pattern. In order to determine the location of a pattern on a wafer, alignment marks are transferred to predefined positions on the substrate as part of said pattern. By measuring the position of the alignment marks, information can be obtained which can be used to transfer a subsequent pattern relative to the previously transferred pattern to the substrate.

The position information of a previously transferred pattern required for accurately transferring a subsequent pattern relative to the previously transferred pattern usually does not correspond one to one to the position information obtained from measuring the position of the alignment marks, as not all areas of a pattern can be used to place alignment marks. As a consequence, alignment marks are usually placed at edges of a pattern or in so-called scribe-lanes, while it is important that the center regions of the pattern used to manufacture devices are aligned with respect to each other.

To solve this, a model can be fitted to the measured positions of the alignment marks. This model can then be used to estimate the position information of a previously transferred pattern that can be used to accurately transfer a subsequent pattern relative to the previously transferred pattern.

For instance, an alignment mark may be positioned at a nominal position (xc, yc). Measuring the position of the alignment mark and comparing the measured position with the nominal position may result in a displacement of the alignment mark by (dx, dy) from the nominal position. This displacement may be used to predict the displacement in every point on the substrate by using a linear 6 parameter model in which the displacement is described in terms of translation, magnification and rotation. For each measurement of one alignment mark, the following equations can be formed:

$$Mx \cdot xc - Ry \cdot yc + Cx = dx$$

$$Rx \cdot xc - My \cdot yc + Cy = dy$$

where xc en yc are the coordinates of the nominal position where the measurement is done, Cx is a translation in x-direction, Cy is a translation in y-direction, Mx is a magnification in x-direction, My is a magnification in y-direction, Rx is a rotation of the x-axis about the z-axis, Ry is a rotation of the y-axis about the z-axis, and dx, dy are the displacement of the alignment mark from the nominal position in respectively the x- and y-direction.

Writing these equations for every mark on the substrate leads to the following system:

$$\begin{bmatrix} dx_i \\ dy_i \end{bmatrix} = \begin{bmatrix} 1 & xc_i & -yc_i & 0 & 0 & 0 \\ 0 & 0 & 0 & 1 & yc_i & xc_i \end{bmatrix} \begin{bmatrix} Cx \\ Mx \\ Rx \\ Cy \\ My \\ Ry \end{bmatrix} \quad i = 1, \ldots, N$$

In matrix vector notations it looks like $\bar{b} = A \cdot \bar{x}$ and matrix A has size 2N×6, where N is the number of alignment marks used.

To be able to find the model parameters to fit (Cx, Cy, Mx, My, Rx and Ry) at least 6 of these equations (i.e. 3 measurements) are needed. Normally, more measurements than parameters are available. This leads to solving an over-determined system of equations, wherein the matrix has more rows than columns. A solution of these equations can be found using the well-known Least Square Method. This can be written as $\bar{x} = (A^T A)^{-1} A^T \bar{b}$.

In order to determine how successful the alignment between two subsequently transferred patterns was, i.e. in order to determine the overlay between two subsequently transferred patterns, both patterns are provided with corresponding overlay marks, so that the position of an overlay mark in one pattern can be measured relative to a corresponding overlay mark of the other pattern.

Overlay is expressed in terms of overlay error, which expresses the deviation of a point in one of the patterns from a perfect alignment with a corresponding point in another layer.

Consequently, perfect overlay results in a zero overlay error, and non-zero overlay errors indicate that the overlay is not perfect. A non-zero overlay error may result from the following error sources.

measurement error in the measuring of the position of an alignment mark, e.g. process induced errors, such as asymmetry, etc.;

placement error in placing the alignment mark at the nominal position, e.g. due to random variations in temperature, pressure, etc.;

measurement error in measuring the overlay error, which can be split into placement error in placing the overlay marks and measurement error in measuring the position of an overlay mark in one pattern relative to a corresponding overlay mark in the other pattern; and model error in fitting the model to the measured displacements of the alignment marks.

Using more measurement data for the earlier described linear model in order to deal with the abovementioned error sources will not improve the accuracy of the model and may lead to productivity loss. Using more measurement data has the advantage that random or semi-random errors in the data are averaged out, so that these errors do not have a large contribution to the overlay.

The model errors, which may have the largest contribution compared to the other error sources, can be dealt with by improving the model, e.g. by using a more advanced alignment model. Different models have been proposed to use instead of the linear model, examples of which are higher order polynomial models, radial basis functions, and extended zone alignment.

However, when such more advanced alignment models are used the contribution of the other error sources to the overlay error becomes more significant, because there is less averaging out. In other words, the performance of every alignment mark has a direct impact on overlay around the location of this alignment mark. As a result thereof, switching to a more advanced model may not result in an improved overlay.

Hence, it becomes more critical to optimally choose alignment mark location and to only use properly functioning alignment marks, which means that in practice, it may be desirable that only the alignment marks are used of which the measured displacement is a good representation of the actual displacement of the alignment mark.

SUMMARY

It is desirable to provide a method to improve overlay, more in particular, it is desirable to provide a method which allows to improve overlay using more advanced alignment models, and most in particular, it is desirable to provide a method which enables to optimally choose alignment marks which can be used to improve overlay.

According to an embodiment of the invention, there is provided a method comprising the following steps:

a) transferring a first pattern to a substrate, said first pattern including at least N alignment marks, wherein each alignment mark is positioned at a respective predefined nominal position in the first pattern;

b) measuring a position of N alignment marks and determining an alignment mark displacement for each of the N alignment marks from the respective nominal position by comparing the respective nominal position of an alignment mark with the respective measured position of said alignment mark;

c) fitting a model to the N alignment mark displacements;

d) transferring a second pattern to the substrate using the fitted model in order to align the second pattern with respect to the first pattern;

e) measuring an overlay error by measuring a relative position of the first pattern with respect to the second pattern, wherein said overlay error is representative for a displacement of the second pattern relative to a perfect alignment between first and second pattern; determining a model error for each of the N alignment marks by comparing the position of an alignment mark according to the fitted model with the respective measured position of said alignment mark;

g) comparing the determined model errors with the overlay error;

h) determining the usefulness of each of the N alignment marks to correct the corresponding overlay error based on the comparison between model errors and overlay error.

In an embodiment, the substrate is processed in between steps a) and b).

According to another embodiment of the invention, there is provided a combination of a lithographic apparatus and an overlay measurement system, wherein the lithographic apparatus comprises:

a substrate table constructed to hold a substrate;

a projection system configured to project the patterned radiation beam onto a target portion of the substrate;

an alignment system with an alignment sensor, said alignment sensor being configured to measure the position of alignment marks on a substrate, and a lithographic apparatus control unit configured to control the position of the patterned radiation beam relative to a substrate based on the measured position of the alignment marks on the substrate;

wherein the overlay measurement system comprises an overlay sensor configured to measure a relative position between two patterns on a substrate, and an overlay measurement control unit configured to determine an overlay error based on the measured relative position, and wherein the lithographic apparatus is configured to carry out the steps a)-d) of the method according to the invention, and wherein the overlay measurement system is configured to carry out steps e)-h) of the method according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
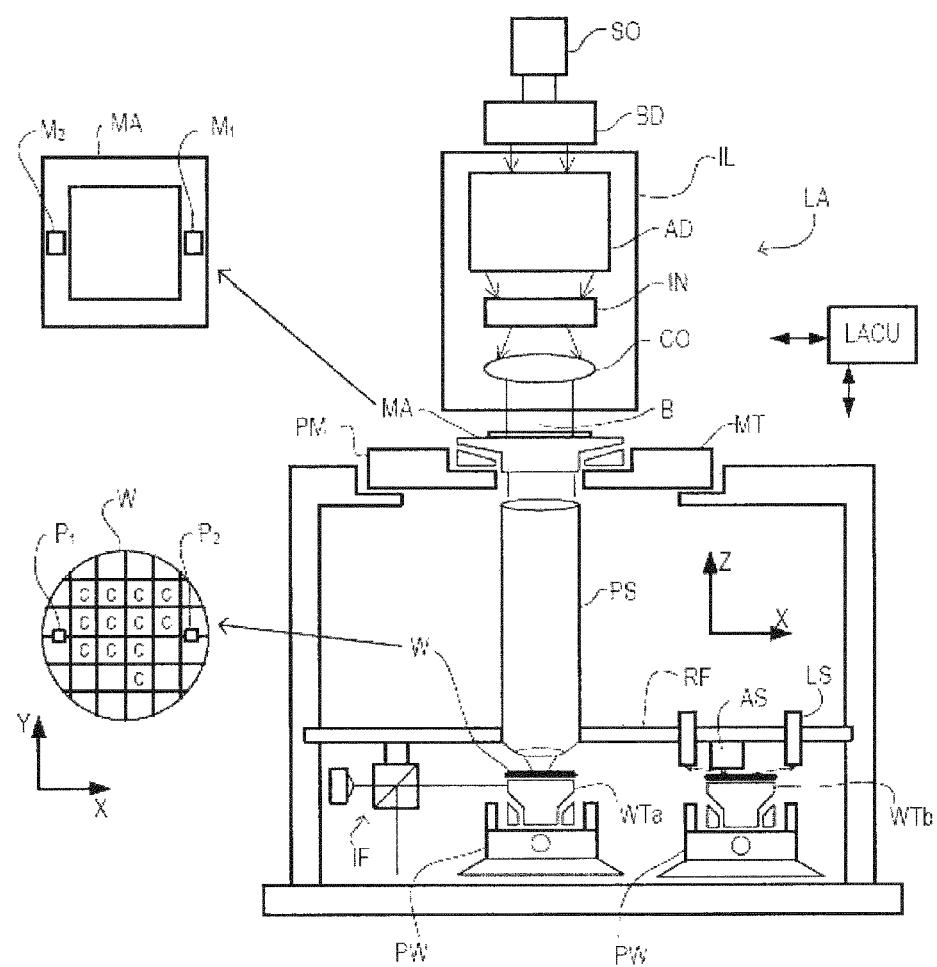
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
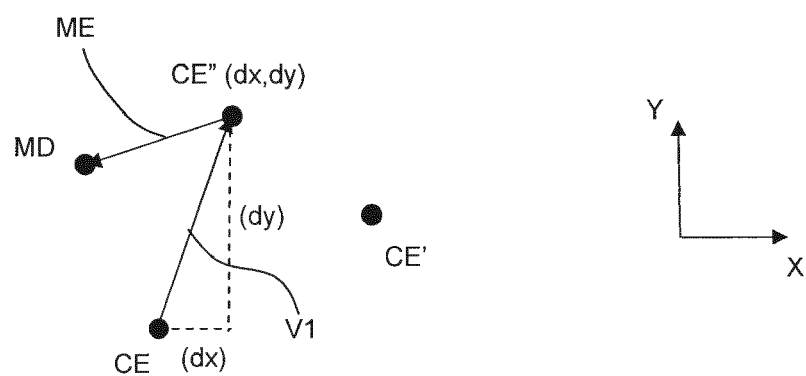
FIG. 2 depicts a center of an alignment mark in different positions.

FIG. 2 depicts schematically in more detail a center of an alignment mark in different positions on a substrate. The alignment mark is transferred to the substrate as part of a first pattern. The alignment mark may be a diffraction grating, allowing the alignment sensor AS to emit light to the grating and to detect the interference pattern in the by the grating diffracted light, i.e. sub-beams diffracted in a first, third and/or higher order are used, in order to determine the position of the grating. In that case, the alignment sensor AS comprises a light source to emit light towards the grating and a detector to detect the diffracted light.

CE indicates the location of the geometrical center of the alignment mark at a nominal position on the substrate relative to a reference point on the substrate, which nominal position is defined as the position on the substrate to which the alignment mark is transferred when exposing the substrate to a radiation beam imparted with the first pattern.

After exposure, the substrate is subjected to different processes as a result of which the substrate may be deformed. Due to this deformation, the location of the alignment mark relative to the reference point may be changed, i.e. displaced. An example thereof is illustrated in FIG. 2 by reference symbol CE' which indicates the geometrical center of the alignment mark after processing of the substrate.

A sensor, such as the alignment sensor AS of FIG. 1, is configured to measure the position of the alignment mark. The measured position of the center of the alignment mark is indicated by reference symbol CE". In a perfect world, the measured position CE" is equal to the displaced position CE'. However, due to measurement errors inherent to all sensors and errors due to asymmetric deformation of the alignment mark due to processing, the measured position CE" is usually not equal to the displaced position CE' as shown in FIG. 2.

Usually, at least N alignment marks are provided on the substrate and the position of the center of N alignment marks is measured, where N is a positive integer with a value of at least two. Measuring the position of the center of an alignment mark may require carrying out two measurements, e.g. one in x-direction and one in y-direction for each of the N alignment marks, but can also be done in one measurement, e.g. one measurement of an oblique alignment mark using a corresponding suitable sensor.

The alignment mark displacement may subsequently be determined by comparing the measured position CE" with the nominal position CE. The displacement may be depicted as a vector V1 having relative coordinates (dx,dy) compared to the nominal position. Although in FIG. 2 this is only shown for one alignment mark, it is to be understood that this process is carried out for each of the N alignment marks and that the outcome for each of the N alignment marks may be different.

In order to use the measured positions of the N alignment marks to transfer a second pattern to the substrate, wherein the measured positions of the N alignment marks are used to align the second pattern with the first pattern, a model is fitted to the measured displacements (dx,dy). An example thereof is already given in the description of the background of the invention, in which a six parameter linear model indicating translation, magnification and rotation of the substrate is fitted to at least three alignment mark displacements (dx,dy). However, higher order alignment models, such as higher order polynomial models, radial base functions, extended zone alignment models, etc., are also possible.

When for the linear model example, more than three alignment marks, each resulting in both a measurement in x and a measurement in y direction, are used as input to the model, an over-determined system of equations needs to be solved. As a result thereof, the model is unlikely to be fitted exactly to all alignment mark displacements, so that according to the fitted model, the modeled displacement of the center of the alignment mark of FIG. 2 may be indicated by MD (see FIG. 2). This modeled position MD of the alignment mark is in this case not equal to the measured position CE" and a model error ME can be determined based on the difference between the modeled position MD and the measured position CE". In FIG. 2, the model error is indicated as a vector and thus includes information about the model error in x-direction and the model error in y-direction.

When the model has been fitted, information from the fitted model, e.g. the model parameters, can be used to transfer a second pattern to the substrate. The model is then used to align the second pattern with respect to the first pattern taking into account the deformations of the substrate after processing.

After transferring the second pattern to the substrate the overlay between first and second pattern can be checked by measuring the relative position of the second pattern with respect to the first pattern. This can for instance be done using an overlay measuring system. In order to measure the overlay, the first and second pattern may be provided with respective first and second overlay marks. By determining the relative position of a first overlay mark with respect to a corresponding second overlay mark, an overlay error can be determined which is representative for the deviation, i.e. the displacement of one pattern relative to the other pattern, from perfect overlay between first and second pattern.

In an embodiment, the alignment marks used to determine the position of the first pattern are also used to measure the overlay error, so that the alignment marks in the first pattern used to measure the position of the first pattern also act as first overlay marks, and alignment marks in the second pattern used to measure the position of the second pattern also act as second overlay marks. However, it is also possible that the alignment marks and first and second overlay marks are separate marks which are preferably, but not necessarily, positioned close to each other.

Figure 3A:
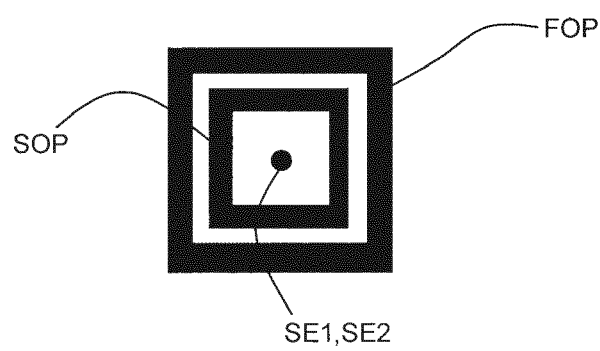
FIG. 3A depicts a first overlay mark in a first pattern perfectly aligned with a second overlay mark in a second pattern.

FIG. 3A shows an example of a first overlay mark FOP and a second overlay mark SOP. The first and second overlay marks are in this example square boxes of different sizes and the geometrical centers SE1, SE2 of the respective boxes should be at the same position for perfect overlay as shown in FIG. 3A.

In an embodiment, the first pattern may be provided with at least M first overlay marks, e.g. embodied as first overlay mark FOP, wherein each first overlay mark is placed at a predefined position in the first pattern, and wherein M is a positive integer with a value of at least two. The second pattern may be provided with second overlay marks, e.g. embodied as second overlay mark SOP, which correspond to the at least M first overlay marks, thereby forming pairs of first and second overlay marks. In an embodiment, M is equal to N, so that each alignment mark has a corresponding pair of first and second overlay marks, which may be placed close to each other, so that the information obtained from the alignment mark substantially corresponds to the information obtained from the pair of first and second overlay marks.

Figure 3B:
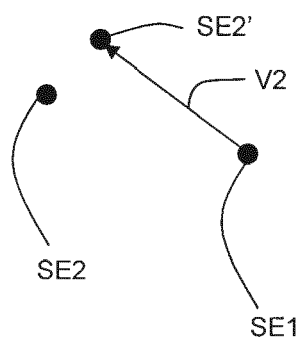
FIG. 3B depicts a relation between a first and a second overlay mark in a less ideal world.

FIG. 3B only shows the geometrical center SE1 of a first overlay mark and the geometrical center SE2 of a second overlay mark associated with the alignment mark of FIG. 2 and not the corresponding overlay marks associated with these centers for clarity reasons. Because of the model error ME and the measurement error between actual center CE' and the measured center CE", e.g. due to alignment mark asymmetry, the overlay will not be perfect as is shown by the distinct centers SE1 and SE2. Measuring the relative position of the centers SE1 and SE2 may introduce a measurement error as is indicated by center SE2' which indicates the relative measured position of center SE2 with respect to the center SE1. As for perfect overlay, the centers SE1 and SE2 should overlap, the overlay error can in this case be expressed as the displacement of the center SE2 with respect to center SE1, which is measured to be equal to the vector V2. It is to be noted that the measured overlay error may thus not be equal to the actual displacement of center SE2 with respect to center SE1, which may be caused by overlay mark asymmetry and measurement errors in the overlay measurement system.

Figure 4:
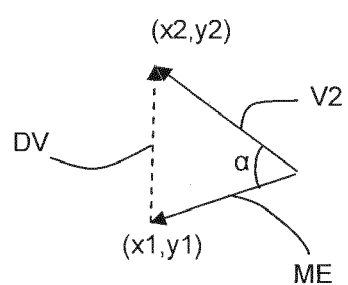
FIG. 4 depicts a comparison between a model error and an overlay error.

For this example, it is assumed that the alignment mark of FIG. 2 and the overlay marks of FIGS. 3A and 3B are close to each other on the substrate, so that information obtained thereof may be compared with each other. FIG. 4 depicts the model error ME of FIG. 2 and the associated overlay error V2 of FIG. 3B as vectors having the same origin for comparison of the model error ME with the overlay error V2. From this comparison a quality factor can be determined for the respective alignment mark indicating the usefulness of the alignment mark to correct the overlay error. For an alignment mark to be useful, the vectors V2 and ME should be about the same magnitude and extend in substantially the same direction. Vectors that are perpendicular to each other and/or differ significantly in magnitude are thus less useful.

The quality factor may then be based on a comparison of the magnitude of the model error ME with the magnitude of the overlay error V2, and on a comparison of the direction of the model error vector ME and the direction of the overlay vector V2. The direction of the model error can for instance be compared with the direction of the overlay error by determining the cosine of the angle $\alpha$ present between the two vectors ME and V2. If the vectors ME and V2 have relative coordinates (x1,y1) and (x2,y2), respectively, the cosine of the angle α may be expressed by the following equation:

$$\cos\alpha = \frac{x1 \cdot x2 + y1 \cdot y2}{\sqrt{(x1^2+y1^2)\cdot(x2^2+y2^2)}}$$

The magnitude can for instance be compared by looking at the ratio r between smallest magnitude and largest magnitude, which in equation form yields:

$$r = \begin{cases} \frac{\sqrt{x1^2+y1^2}}{\sqrt{x2^2+y2^2}}, & \text{if } \sqrt{x2^2+y2^2} > \sqrt{x1^2+y1^2} \\ \frac{\sqrt{x2^2+y2^2}}{\sqrt{x1^2+y1^2}}, & \text{if } \sqrt{x1^2+y1^2} > \sqrt{x2^2+y2^2} \end{cases}$$

The quality factor may now for instance be expressed as the product of cos α and r. The cosine of the angle α and the ratio r can also be used as separate criteria for the quality factor or any other combination of the two.

When the quality factor is expressed as the product of cos α and r, the most useful alignment marks score a value of 1 or −1 and the least useful alignment marks score a value of 0. The values of 1 or −1 are a result of how the overlay error is measured. In FIG. 3B, the overlay error is expressed as a vector running from center SE1 to center SE2'. However, a vector running from SE2' to center SE1 also gives the overlay error, but this vector is rotated 180 degrees relative to the shown vector V2. Depending on the direction of vector V2, the most useful alignment marks score a value of 1 or −1.

The direction and magnitude of the vectors ME and V2 may also be compared by looking at a difference vector DV indicating the difference between vectors ME and V2, i.e. vector DV is obtained by subtracting one vector from the other vector. The difference vector DV is also shown in FIG. 4.

The quality factor can for instance be based on the magnitude of the difference vector DV, wherein the larger the magnitude of the difference vector DV, the less useful the alignment mark is to correct overlay. The magnitude Ed of the difference vector DV can for the example of FIG. 4 be expressed as:

$$Ed = \sqrt{(x2-x1)^2+(y2-y1)^2}$$

It is further possible to use statistics over multiple substrates using the same first and second pattern and to determine an average and standard deviation of the abovementioned criteria to determine the usefulness of an alignment mark. The advantage of using statistics is that alignment marks showing a relatively large standard deviation, which are thus less reliable, can also be identified and be considered as less useful than originally determined using a single measurement only. The average is thus used as the quality factor, but the standard deviation adds an additional filter or criterion to asses the reliability or robustness of an alignment mark.

The usefulness of an alignment mark can be used in a lithographic apparatus, which transfers patterns to substrates using the alignment marks. The lithographic apparatus control unit may be configured based on the method according to the invention to only use a subset of the N alignment marks which are considered to be the most useful to correct overlay.

Figure 5:
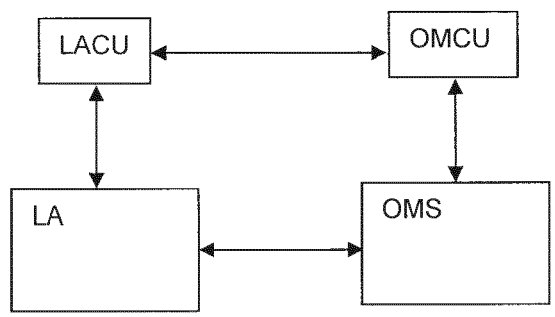
FIG. 5 schematically depicts the interaction between a lithographic apparatus and an overlay measurement system.

An example can be found in FIG. 5 in which schematically a lithographic apparatus control unit LACU is shown configured to control different processes in a lithographic apparatus LA, e.g. the lithographic apparatus of FIG. 1, and which lithographic apparatus control unit is configured to:

control the lithographic apparatus in order to provide a substrate with a first pattern, said first pattern including at least N alignment marks, wherein each alignment mark is placed at a respective predefined nominal position in the first pattern;

measure a position of N alignment marks using an alignment sensor, e.g. the alignment sensor AS of FIG. 1, and to determine an alignment mark displacement for each of the N alignment marks from the respective nominal position by comparing the nominal position of an alignment mark with the corresponding measured position of said alignment mark, e.g. by subtracting the nominal position from the measured position;

fit a model to the N alignment mark displacements in order to be able to estimate the displacement in every point of the substrate; and control the lithographic apparatus in order to transfer a second pattern to the substrate using the fitted model in order to align the second pattern with respect to the first pattern.

After transferring the second pattern to the substrate, the substrate is transferred to an overlay measurement system OMS which is controlled by an overlay measurement control unit OMCU. The lithographic apparatus control unit LACU will provide the overlay measurement control unit OMCU with information about the alignment marks. This can for instance be done by providing information about the fitted model and the measured positions of the N alignment marks, so that the overlay measurement control unit is able to determine a model error for each of the N alignment marks by comparing the position of an alignment mark according to the fitted model with the respective measured position of said alignment mark, or the lithographic apparatus control unit LACU determines the model error for each of the N alignment marks by comparing the position of an alignment mark according to the fitted model with the respective measured position of said alignment mark and provides the determined model errors to the overlay measurement control unit as input.

The overlay measurement control unit is configured to control the overlay measurement system in order to measure an overlay error by measuring a relative position of the first pattern with respect to the second pattern, wherein said overlay error is representative for a displacement of the second pattern relative to a perfect alignment between first and second pattern. In an embodiment, the overlay measurement control unit measures an overlay error at multiple positions on the substrate, more particularly, the multiple positions may correspond to the N alignment marks, so that an overlay error per alignment mark can be determined.

Subsequently, the model errors relating to the N alignment marks can be compared to the corresponding overlay errors and the usefulness of each of the N alignment marks to correct overlay can be determined. This information can be fed back to the lithographic apparatus control unit LACU so that in subsequent patterning processes the model is fitted to a subset of the N alignment mark displacements, wherein the subset contains data from the most useful alignment marks as determined by the overlay measurement control unit.

Instead of using a subset, all N alignment marks may be used as input to the model, but the data corresponding to the alignment marks may be weighed in accordance with the determined usefulness, so that useful alignment marks have a larger contribution to the fitted model than less useful alignment marks, which can be implemented by using a weighing factor which increases in value with increasing usefulness. The outcome of the weighing may be that in practice only a subset is used as the weighing factor for some alignment marks may be substantially zero. In other words, the weighing factor is 1 if a corresponding usefulness is above a certain threshold and zero if a corresponding usefulness is below a certain threshold.

The information send to the lithographic apparatus control unit LACU by the overlay measurement control unit OMCU about the usefulness of the alignment marks may be regularly updated to ensure that the data from the alignment marks is optimally used to correct overlay. This only requires substrates to regularly be transferred to the overlay measurement system in order to determine the usefulness of the alignment marks and to update the information send to the lithographic apparatus control unit LACU. As a result, an alignment mark initially identified as being very useful may gradually change to an alignment mark being less useful and the other way around, so that regularly updating this information will result in a change in the use of the alignment marks with the effect that the overlay error does not get significantly worse over time.

In an embodiment, it is possible that the model used to model the alignment mark displacements for determining the usefulness of the alignment marks to correct overlay is not the same model that is normally used in production mode. For instance, the usefulness of the alignment marks may be determined using a linear six parameter model as described above, where in normal production mode, the lithographic apparatus control unit uses a more advanced model, such as a higher order polynomial model or a model based on radial base functions.

Although the method according to the invention can be used with linear models, the use for advanced models poses the most advantages as optimally choosing the alignment marks has a larger impact on overlay when using advanced models than when using linear models as in advanced models the deviations from the actual position of alignment marks have a larger impact on overlay and are less averaged out as in linear models.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method comprising:
   a) transferring a first pattern to a substrate, said first pattern including at least N alignment marks, wherein each alignment mark is positioned at a respective predefined nominal position in the first pattern;
   b) measuring a position of each of the N alignment marks and determining an alignment mark displacement for each of the N alignment marks from the respective nominal position by comparing the respective nominal position of an alignment mark with the respective measured position of said alignment mark;
   c) fitting a model to the N alignment mark displacements;
   d) transferring a second pattern to the substrate using the fitted model in order to align the second pattern with respect to the first pattern;
   e) measuring an overlay error by measuring a relative position of the first pattern with respect to the second pattern, wherein said overlay error is representative for a displacement of the second pattern relative to a perfect alignment between first and second pattern;
   f) determining a model error for each of the N alignment marks by comparing the position of an alignment mark according to the fitted model with the respective measured position of said alignment mark;
   g) comparing the determined model errors with the overlay error; and
   h) determining a usefulness of each of the N alignment marks to correct the corresponding overlay error based on the comparison between model errors and overlay error.

2. A method according to claim 1, wherein the first pattern is provided with at least M first overlay marks, wherein each first overlay mark is placed at a predefined position in the first pattern,
wherein the second pattern is provided with second overlay marks corresponding to the at least M first overlay marks, thereby forming pairs of first and second overlay marks,
and wherein the overlay error is measured by measuring the relative position of a first overlay mark with respect to a corresponding second overlay mark.

3. A method according to claim 2, wherein each of the N alignment marks has a corresponding pair of first and second overlay marks, so that each model error has a corresponding overlay error, and wherein comparing the model errors with the overlay error includes comparing the model error with the corresponding overlay error.

4. A method according to claim 3, wherein comparing the model error with the corresponding overlay error includes comparing a magnitude of the model error with a magnitude of the corresponding overlay error, and/or comparing a direction of the model error with a direction of the corresponding overlay error.

5. A method according to claim 4, wherein the model errors and overlay errors are respectively defined as model error vectors and overlay error vectors, and wherein the usefulness of an alignment mark to correct overlay is based on a combination of the cosine of an angle between a model error vector and a corresponding overlay error vector, and/or the ratio between the magnitude of the model error vector and the overlay error vector.

6. A method according to claim 3, wherein the model errors and overlay errors are respectively defined as model error vectors and overlay error vectors, and wherein comparing the model error with the corresponding overlay error includes evaluating a vector difference between a model error vector and a corresponding overlay error vector.

7. A method according to claim 6, wherein the usefulness of an alignment mark to correct overlay is based on the magnitude of the vector difference.

8. A method according to claim 1, wherein the transferring a first pattern, measuring a position, fitting a model, transferring a second pattern, measuring an overlay error, determining a model error and comparing errors are carried out for multiple different substrates, wherein a quality factor is determined for each of the N alignment marks on the multiple substrates, said quality factor being representative for the usefulness of an alignment mark of a particular substrate to correct overlay, and wherein the usefulness of an alignment mark to correct overlay in the determining the usefulness is based on an average and/or standard deviation of the quality factors associated with the same alignment marks across the multiple substrates.

9. A method according to claim 1, wherein the method after determining the usefulness of an alignment mark to correct overlay comprises the step of configuring a lithographic apparatus to perform the transferring a first pattern, measuring a position, fitting a model, and transferring a second pattern,
wherein a model is fitted to the alignment mark displacements using weighed alignment mark displacements as input to the model, said weighing being based on the corresponding usefulness, so that more useful alignment marks have a larger contribution to the fitted model than less useful alignment marks.

10. A method according to claim 9, wherein weighing is carried out using weighing factors, wherein the weighing factor is 1 if a corresponding usefulness is above a certain threshold and zero if a corresponding usefulness is below a certain threshold.

11. A method according to claim 9, wherein the usefulness is determined using a first model fitted to the alignment mark displacements, and wherein subsequently the lithographic apparatus is configured to carry out the transferring a first pattern, measuring a position, fitting a model, and transferring a second pattern using a second model which is more advanced than the first model.

12. A method according to claim 9, wherein while the lithographic apparatus is continuously carrying out the transferring a first pattern, measuring a position, fitting a model, and transferring a second pattern for production purposes, and wherein the measuring an overlay error, determining a model error, comparing the errors and determining the usefulness are regularly carried out to update the usefulness and thus the weighing of the alignment mark displacements inputted to the model.

13. In combination a lithographic apparatus and an overlay measurement system, wherein the lithographic apparatus comprises:
an illumination system configured to condition a radiation beam;
a support constructed to support a patterning device, the patterning device being capable of imparting the radiation with a pattern in its cross-section to form a patterned radiation beam;
a substrate table constructed to hold a substrate;
a projection system configured to project the patterned radiation beam onto a target portion of the substrate;
an alignment system with an alignment sensor, said alignment sensor being configured to measure the position of alignment marks on a substrate, and
a lithographic apparatus control unit configured to control the position of the patterned radiation beam relative to a substrate based on the measured position of the alignment marks on the substrate;
wherein the overlay measurement system comprises an overlay sensor configured to measure a relative position between two patterns on a substrate, and an overlay measurement control unit configured to determine an overlay error based on the measured relative position,
wherein the lithographic apparatus is configured to carry out:
a) transferring a first pattern to a substrate, said first pattern including at least N alignment marks, wherein each alignment mark is positioned at a respective predefined nominal position in the first pattern;
b) measuring a position of N alignment marks and determining an alignment mark displacement for each of the N alignment marks from the respective nominal position by comparing the respective nominal position of an alignment mark with the respective measured position of said alignment mark;
c) fitting a model to the N alignment mark displacements;
d) transferring a second pattern to the substrate using the fitted model in order to align the second pattern with respect to the first pattern;
and wherein the overlay measurement system is configured to carry out:
e) measuring an overlay error by measuring a relative position of the first pattern with respect to the second pattern, wherein said overlay error is representative for a displacement of the second pattern relative to a perfect alignment between first and second pattern;

f) determining a model error for each of the N alignment marks by comparing the position of an alignment mark according to the fitted model with the respective measured position of said alignment mark;

g) comparing the determined model errors with the overlay error; and h) determining a usefulness of each of the N alignment marks to correct the corresponding overlay error based on the comparison between model errors and overlay error.

14. The combination of claim 13, wherein the usefulness of the alignment marks determined by the overlay measurement system is provided to the lithographic apparatus control unit, and wherein the lithographic apparatus control unit is configured to carry out the fitting a model by fitting a model to the alignment mark displacements using weighed alignment mark displacements as input to the model, said weighing being based on the corresponding usefulness of the alignment marks, so that more useful alignment marks have a larger contribution to the fitted model than less useful alignment marks.

15. The combination of claim 14, wherein the overlay measurement system is configured to regularly carry out the measuring an overlay error, determining a model error, comparing the determined model errors and determining the usefulness in order to regularly update the usefulness of the alignment marks and thus also the weighing of the alignment mark displacements.

* * * * *

UNITED STATES PATENT AND TRADEMARK OFFICE
CERTIFICATE OF CORRECTION

PATENT NO.       : 9,454,084 B2                                    Page 1 of 1
APPLICATION NO.  : 14/403577
DATED            : September 27, 2016
INVENTOR(S)      : Irina Lyulina et al.

It is certified that error appears in the above-identified patent and that said Letters Patent is hereby corrected as shown below:

On the Title Page

Column 2, Item (56) References Cited - Other Publications, Line 8:
Replace "International Search report and Written Opinion mailed Jan. 30, 2014 in corresponding International Patent Application No. PCT/US2013/068376, 11 pages,"
With --International Search report and Written Opinion mailed Jan. 30, 2014 in corresponding International Patent Application No. PCT/US2013/058375, 11 pages--.

Signed and Sealed this
Twentieth Day of March, 2018

Andrei Iancu
*Director of the United States Patent and Trademark Office*